(12) United States Patent
Wang

(10) Patent No.: US 7,750,474 B1
(45) Date of Patent: Jul. 6, 2010

(54) METAL PROGRAMMABLE LOGIC AND MULTIPLE FUNCTION PIN INTERFACE

(75) Inventor: Yongjiang Wang, Austin, TX (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 12/258,087

(22) Filed: Oct. 24, 2008

Related U.S. Application Data

(60) Provisional application No. 60/984,596, filed on Nov. 1, 2007.

(51) Int. Cl.
*H01L 23/48* (2006.01)
(52) U.S. Cl. ........... 257/758; 257/774; 257/E23.015
(58) Field of Classification Search ........... 257/734, 257/758, 774, 776, E23.01, E21.495, E23.015; 438/618
See application file for complete search history.

(56) References Cited

U.S. PATENT DOCUMENTS 5,815,726 A * 9/1998 Cliff ........................ 712/1
6,331,733 B1 * 12/2001 Or-Bach et al. ............. 257/758

* cited by examiner

*Primary Examiner*—Roy K Potter

(57) ABSTRACT

Some of the embodiments of the present invention provide an integrated circuit device including a first metal interconnect, an end of which is coupled to a core of the integrated circuit device, a second metal interconnect, an end of which is coupled to a first input/output (I/O) pin, and a third metal interconnect configured to be coupled to the first metal interconnect and to the second metal interconnect. Other embodiments are also described and claimed.

12 Claims, 4 Drawing Sheets

US 7,750,474 B1

METAL PROGRAMMABLE LOGIC AND MULTIPLE FUNCTION PIN INTERFACE

CROSS REFERENCE TO RELATED APPLICATIONS

The present application claims priority to U.S. Patent Application No. 60/984,596 filed Nov. 1, 2007, entitled "METAL PROGRAMMABLE LOGIC AND MULTIPLE FUNCTION PIN INTERFACE," the entire specification of which is hereby incorporated by reference in its entirety for all purposes, except for those sections, if any, that are inconsistent with this specification.

TECHNICAL FIELD

Embodiments of the present invention relate to the field of multiple function pin interfaces, and more particularly, to metal programmable logic and multiple function pin interfaces.

BACKGROUND

Increasingly, integrated circuits (IC) are becoming more powerful, with more functionality included in an IC chip. For example, a system on chip (SOC) may integrate numerous components of a computing system into a single integrated circuit chip and may include digital, analog, mixed-signal, and radio-frequency functions in a single chip. With an increase in the number of functions included in a chip, the demand for greater number of input/output (I/O) pins is also increasing. However, it may not always be feasible to provide a large number of I/O pins because of limitations in the size, complexity and/or cost of the chip.

A multiple function I/O pin may be used in a chip, which allows some flexibility in the usage of an I/O pin. As the name suggests, a multiple function I/O pin may be used for various purposes, based on a usage model of the chip, and may result in a reduction in pin count of the chip. FIG. 1 illustrates an exemplary block diagram of a multiple function pin interface (MFPI) 10. The MFPI 10 may include a plurality of function-out buses 34 (F1, ..., F8) and a plurality of function-in buses 38 (M1, ..., M4). Note that the number of function-out bus 34 and function-in bus 38 are purely exemplary in nature. In various embodiments, it may be intended to couple only one of the function-out buses 34 and/or only one of the function-in buses 38, at any given time, to an I/O pin 14 included in the MFPI 10. The I/O pin 14 may be coupled to a multiplexer 22 and a demultiplexer 26 through an I/O pad 18, which may control one or more functions of the I/O pin 14. One or more programmable registers 30 may control the operation of the multiplexer 22 and the demultiplexer 26. The programmable registers 30 may be programmed to couple a selected one of the function-out bus 34 and/or a selected one of the function-in bus 38 to the I/O pin 14 at any given time, based on a usage model of the chip in which the MFPI 10 is included. Thus, if it is intended to output function-output signal F3 to the I/O pin 14, it may be achieved by programming the programmable registers 30 and the multiplexer 22 accordingly.

As will be readily understood by those skilled in the art, several well known components of the MFPI 10 (e.g., input enable, output enable, drive strength control, slew rate control, pull up, pull down, etc.) have not been illustrated in FIG. 1 for the purpose of clarity.

FIG. 2 illustrates an exemplary block diagram of a multiplexing system 50, which may be used in the MFPI 10 of FIG. 1. In various embodiments, the multiplexing system 50 may be used as the multiplexer 22 of FIG. 1, and may include a plurality of multiplexers 54, 58, 62 and 66. In various embodiments, one or more programmable registers (not illustrated in FIG. 2), as stated previously with reference to the programmable register 30 of FIG. 1, may be used to control one or more of the multiplexers 54, 58, 62 and 66 of FIG. 2. The multiplexing system 50 may implement a differential timing priority for the function-out bus signals F1, ..., F7. For example, the signal F1 may be coupled to the output Fout through only one multiplexer (multiplexer 66), while other signals (e.g., F3) may be coupled to the output Fout through a higher number of multiplexers (e.g., multiplexers 58, 62 and 66). Thus, the signal F1, if selected, may reach the output Fout in less time, whereas other function-out signals, if selected, may take more time to reach the output Fout, based at least in part on the number of multiplexers the signals have to traverse through before reaching the output. In various embodiments, the delay block 70 may be utilized to overcome certain design issues, e.g., hold time, etc. As will be apparent to those skilled in the art, in various embodiments, signal F1 may be the highest priority function-out bus signal, F2 may be the next highest priority function-out bus signal, and so on, and F7 may be the lowest priority function-out bus signal.

It should be apparent that the multiplexing system 50 is exemplary in nature, and a different number and/or configuration of the individual multiplexers may also be possible. Additionally, a differential timing priority demultiplexing system may also be envisioned by those skilled in the art for the demultiplexer 26 of FIG. 1.

The MFPI 10 of FIG. 1, optionally along with the multiplexing system 50 of FIG. 2, may be used to reduce the pin count of a chip. For example, using the MFPI system, only one I/O pin may be used for the plurality of function-out signals F1, ..., F7 and the plurality of function-in signals M1, ..., M4. Without the MFPI 10, each function-out signal and each function-in signal would have required a separate I/O pin.

In spite of its various advantages, however, the MFPI 10 may also have a few drawbacks. For example, the chip in which the MFPI 10 may be included may be a generic chip, the use of which may depend on a usage model of the chip. That is, a usage model of the chip may define which of the function-out bus and the function-in bus may be connected to the I/O pin 14. For example, for a first usage model required by a first user of the chip, the chip may always couple the F3 and M2 signals to the I/O pin 14; while for a second usage model required by a second user, the chip may always couple the F4 and M3 signals to the I/O pin 14.

Although the multiplexer 22 and the de-multiplexer 26 may have the required flexibility to enable the chip to be used for either the first usage model or the second usage models, the timing issues discussed previously with respect to the multiplexing system 50 may pose certain difficulties. For example, according to the first usage model, the F3 signal may be coupled to the I/O pin 14. However, the F3 signal may have to undergo a certain delay (as the signal needs to pass through three multiplexers before reaching the output pin) when trying to reach I/O pin 14. Also, during the last phase of the design stage (or immediately before tape-out and/or manufacturing) of the chip, it may not be easily possible to change the configuration of the multiplexer 22 of FIG. 1 or the multiplexing system 50 of FIG. 2, on the fly, to make F3 the highest priority signal, because such a change in the configuration may affect several other timing issues related to various other signals and components of the chip. Thus, a chip designed for the previously discussed first usage model may not be easily re-designed for the second usage model. Also, there may be situations where even larger numbers of function-in and function-out signals may be intended to be coupled to the I/O pin 14, which may necessitate a more complex multiplexing system 50.

SUMMARY

In various embodiments, the present invention provides an apparatus and a method for metal programmable logic and multiple pin interfaces. More specifically, there is provided, in accordance with various embodiments of the present invention, an integrated circuit device comprising a first metal interconnect, an end of which is coupled to a core of the integrated circuit device, a second metal interconnect, an end of which is coupled to a first input/output (I/O) pin, and a third metal interconnect configured to be coupled to the first metal interconnect and to the second metal interconnect. In various embodiments, the first metal interconnect and the second metal interconnect may be substantially parallel to each other, and the third metal interconnect may be further configured to electrically interconnect the first metal interconnect with the second metal interconnect.

In various embodiments, the third metal interconnect may be further configured to be coupled to the first metal interconnect and the second metal interconnect through a first via and a second via, respectively. At least one segment of the third metal interconnect may be configured to be substantially perpendicular to the first metal interconnect and the second metal interconnect. In various embodiments, the first I/O pin may be a multifunction pin. The integrated circuit device may further comprise a fourth metal interconnect, an end of which may be coupled to another core of the integrated circuit device, and a fifth metal interconnect, an end of which may be coupled to a second I/O pin, wherein the fourth metal interconnect and the fifth metal interconnect may be substantially parallel to the first metal interconnect and the second metal interconnect, and wherein the third metal interconnect may lie in a plane that is different from a plane that includes the fourth metal interconnect and a plane that includes the fifth metal interconnect such that the third metal interconnect is not electrically interconnected to either the fourth metal interconnect or the fifth metal interconnect.

The integrated circuit device may further comprise a sixth metal interconnect, wherein the sixth metal interconnect may be configured to be coupled to the fourth metal interconnect and the fifth metal interconnect, and wherein a segment of the sixth metal interconnect may be substantially perpendicular to both the fourth metal interconnect and the fifth metal interconnect. The integrated circuit device may have a system on chip (SOC) architecture.

There is also provided, in accordance with various embodiments of the present invention, a method comprising coupling an end of a first metal interconnect to a core of an integrated circuit device, coupling an end of a second metal interconnect to a first input/output (I/O) pin, and coupling a first end of a third metal interconnect to the first metal interconnect, and a second end of the third metal interconnect to the second metal interconnect. In various embodiments, the method may further comprise arranging the first metal interconnect and the second metal interconnect such that the first metal interconnect and the second metal interconnect are substantially parallel to each other. The coupling of the third metal interconnect may further comprise coupling the third metal interconnect to the first metal interconnect and the second metal interconnect such that the first metal interconnect may be electrically coupled to the second metal interconnect through the third metal interconnect.

In various embodiments, the coupling of the third metal interconnect may further comprise coupling the first end of the third metal interconnect to the first metal interconnect and the second end of the third metal interconnect to the second metal interconnect through a first via and a second via, respectively. The method may further comprise arranging the third metal interconnect such that a segment of the third metal interconnect is substantially perpendicular to the first metal interconnect and the second metal interconnect. The method may further comprise coupling an end of a fourth metal interconnect to another core of the integrated circuit device, and coupling an end of a fifth metal interconnect to a second input/output (I/O) pin, wherein the fourth metal interconnect and the fifth metal interconnect may be substantially parallel to the first metal interconnect and the second metal interconnect, and wherein the third metal interconnect may lie in a plane that is different from a plane that includes the fourth metal interconnect and a plane that includes the fifth metal interconnect such that the third metal interconnect is not electrically coupled to either the fourth metal interconnect or the fifth metal interconnect.

In various embodiments, the method may further comprise coupling a first end of a sixth metal interconnect to the fourth metal interconnect and coupling a second end of the sixth metal interconnect to the fifth metal interconnect, wherein a segment of the sixth metal interconnect may be substantially perpendicular to the fourth metal interconnect and the fifth metal interconnect.

There is also provided, in accordance with various embodiments of the present invention, an integrated circuit chip comprising a plurality of input/output (I/O) pins, parallel to each other, a plurality of core pins, each core pin coupled to a core of the integrated circuit chip, and a plurality of shorting bars, wherein a first end of a first shorting bar of the plurality of shorting bars is configured to be coupled to a first I/O pin of the plurality of I/O pins and a second end of the first shorting bar may be configured to be coupled to a first core pin of the plurality of core pins. In various embodiments, the first shorting bar may be configured to electrically interconnect the first I/O pin and the first core pin. In various embodiments, the integrated circuit device may have a system on chip (SOC) architecture. The first I/O pin and the first core pin may be substantially parallel to each other, and perpendicular to the first shorting bar.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Figure 3:
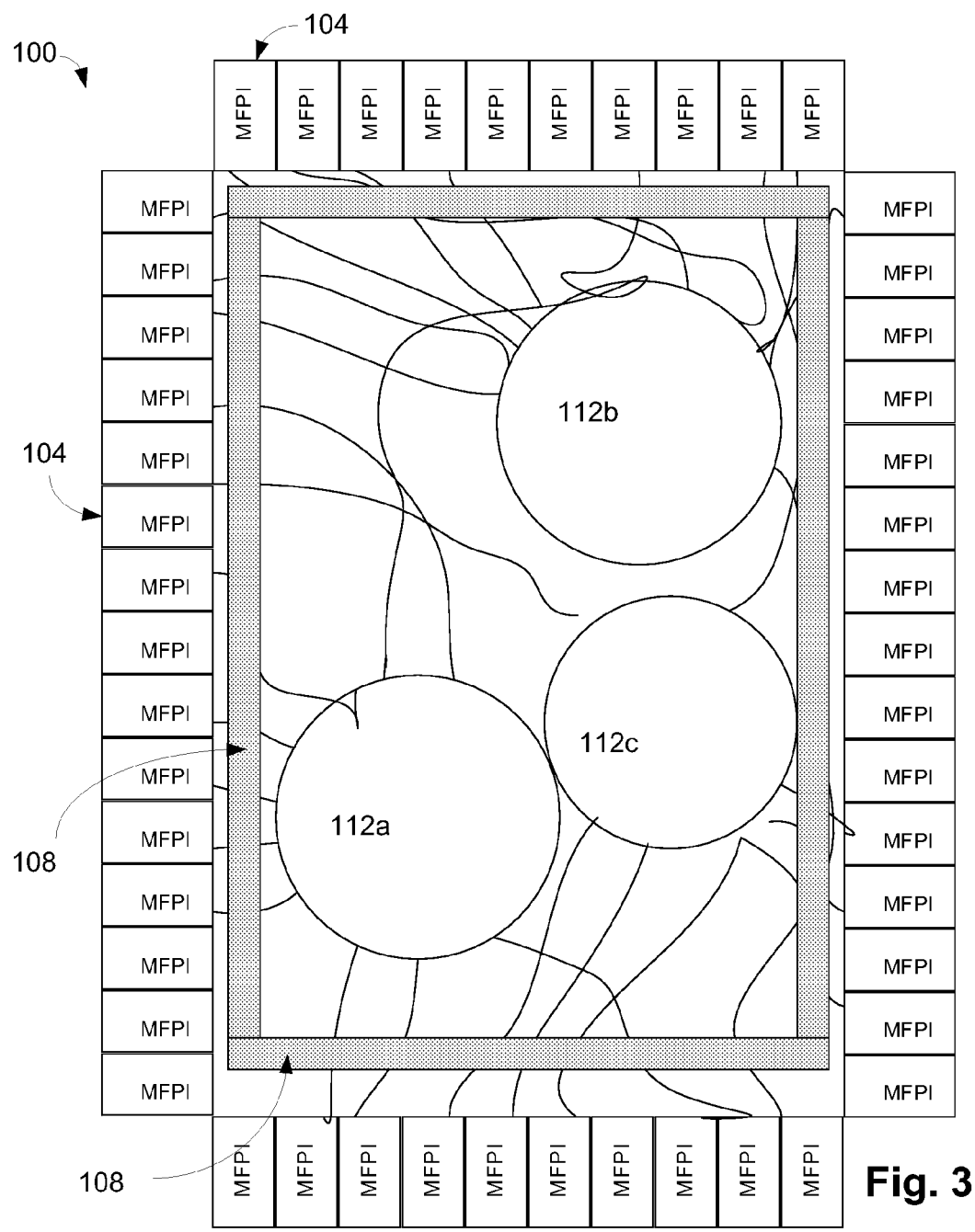
FIG. 3 illustrates an exemplary integrated circuit (IC) chip including a connection box, in accordance with various embodiments of the present invention.

FIG. 3 illustrates an exemplary integrated circuit (IC) chip 100 including a connection box 108, in accordance with various embodiments of the present invention. In various embodiments, the chip 100 may include a plurality of cores 112a, 112b and 112c. It should be apparent that the number, arrangement, shape and/or position of the cores in FIG. 3 are purely exemplary in nature. In various embodiments, the chip 100 may have a single core as well. In various embodiments, the chip 100 may have SOC architecture, and may integrate a plurality of components of a computing system or any other electronic system into the chip.

In various embodiments, the chip 100 may include a plurality of multiple function pin interfaces (MFPIs) 104 arranged along the periphery of the chip. As will be readily apparent, the number and/or arrangement of the MFPIs 104 are purely exemplary in nature. A different number and/or configuration of the MFPIs are also possible. In various embodiments, each of the MFPIs 104 may be similar to the MFPI 10 of FIG. 1. In various other embodiments, any other multiple function pin interface known to those skilled in the art may also be used. In various other embodiments, each of the MFPIs 104 may include an I/O pin, an I/O pad and other components necessary for an I/O and/or MFPI interface. Unlike FIG. 1, however, the MFPI 104 may not include a multiplexer and/or a demultiplexer, as will be discussed in more detail herein later.

FIG. 3 also illustrates a plurality of interconnections between the MFPIs 104 and the core(s) and/or other components of the chip 100. It should be noted that the shapes, numbers and/or contours of the interconnections of FIG. 3 are purely exemplary in nature.

In various embodiments, the connection box 108 may be placed between the MFPIs 104 and the core of the chip 100, along the periphery of the chip, and may provide an additional level of programmability in terms of coupling a plurality of core pins with a plurality of I/O pins (included in the MFPIs 104), as will be discussed in more detail herein later.

Figure 4:
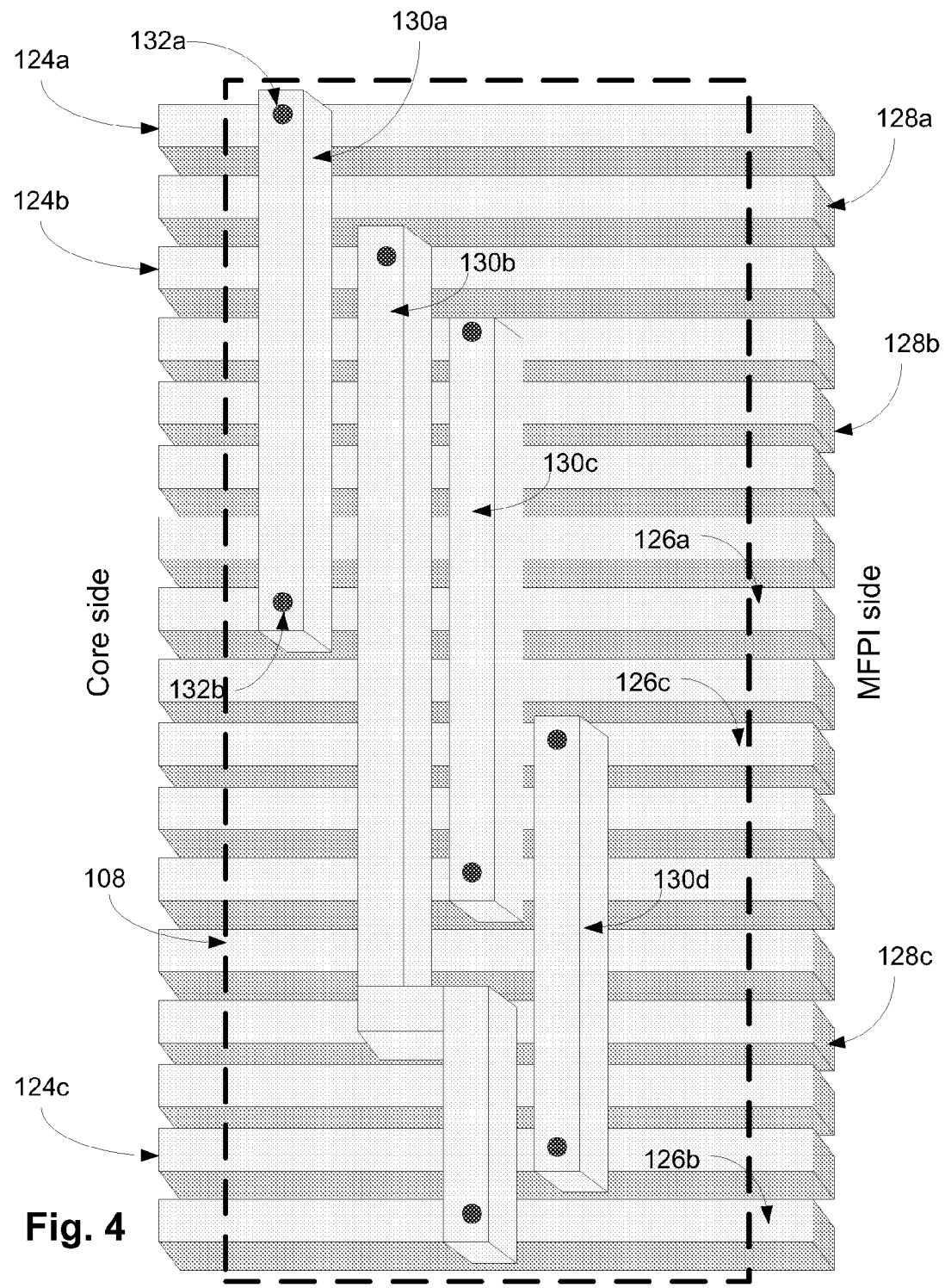
FIG. 4 illustrates an exemplary block diagram of a segment of the integrated circuit chip of FIG. 3, including a segment of the connection box, in accordance with various embodiments of the present invention.

FIG. 4 illustrates an exemplary block diagram of a segment of the integrated circuit chip 100 of FIG. 3, including a segment of the connection box 108, in accordance with various embodiments of the present invention. The segment of the connection box 108 in FIG. 4 is illustrated by a dotted line. Note that as illustrated in FIGS. 3 and 4, the connection box 108 has the MFPI pins on one side (referred to as the "MFPI side" in FIG. 4) and the core of the chip 100 on the other side (referred to as the "core side" in FIG. 4).

FIG. 4 illustrates a first plurality of metal interconnects 124a, 124b and 124c, parallel to each other. Although not illustrated in FIG. 4, in various embodiments, an end of each of the metal interconnects 124a, 124b and 124c may be coupled to one or more cores (or other components) of the chip 100, and the metal interconnects 124a, 124b and 124c may be referred to as core pins. More specifically, the end of the core pins 124a, 124b and 124c on the 'core side' of FIG. 4 may be coupled to the one or more cores (or other components) of the chip 100. The other end (on the MFPI side) of the core pins 124a, 124b and 124c may not be directly coupled to the MFPIs 104.

FIG. 4 also illustrates a second plurality of metal interconnects 126a, 126b and 126c, parallel to each other. Although not illustrated in FIG. 4, in various embodiments, an end of each of the metal interconnects 126a, 126b and 126c may be coupled to one or more I/O pins, e.g., one or more I/O pins included in the MFPIs 104 of the chip 100. Accordingly, metal interconnects 126a, 126b and 126c may be referred to as MFPI pins. More specifically, the end of the MFPI pins 126a, 126b and 126c on the 'MFPI side' of FIG. 4 may be coupled to respective MFPIs 104 of the chip 100. The other end of the MFPI pins 126a, 126b and 126c (on the core side) may not be directly coupled to the core (or other components) of the chip 100.

The connection box of FIG. 4 may include a third plurality of metal interconnects 130a, 130b and 130c, which may be configured to selectively short (i.e., electrically couple) respective MFPI pins with respective core pins, and the metal interconnects 130a, 130b and 130c may be referred to as shorting bars. In various embodiments, an end of each of the shorting bars 130a, 130b and 130c may be coupled to a respective one of the core pins 124a, 124b and 124c. Similarly, another end of each of the shorting bars 130a, 130b and 130c may be coupled to a respective one of the MFPI pins 126a, 126b and 126c. The coupling of an end of a shorting bar to a respective core pin or a respective MFPI pin may be achieved through a respective via.

For example, an end of the shorting bar 130a may be coupled to the core pin 124a through via 132a, while another end of the shorting bar 130a may be coupled to the MFPI pin 126a through via 132b. Thus, the core pin 124a may be electrically interconnected to the MFPI pin 126a through the shorting bar 130a. Similarly, shorting bar 130b may electrically interconnect the core pin 124b and MFPI pin 126b.

In various embodiments, some of the shorting bars (e.g., 130a and 130c) may be parallel to each other and perpendicular to the core pins and the MFPI pins. In various embodiments, a segment of some of the shorting bars (e.g., 130b) may be parallel to the other shorting bars (e.g., 130a and 130c) and perpendicular to the core pins and the MFPI pins. As will be readily apparent to those skilled in the art, the shorting bars may have any other shapes and/or configuration.

Note that only some of the core pins and the MFPI pins have been labeled in FIG. 4 for the purpose of clarity (some of the unlabeled pins may be core pins, and the rest MFPI pins). Also, not all core and MFPI pins may be coupled to a shorting bar. For example, pins 128*a*, 128*b*, 128*c* (some of which may be core pins and the rest MFPI pins) in FIG. 4 may not be coupled to any shorting bars.

As previously discussed, in various embodiments, the core pins and the MFPI pins may be parallel to each other, such that they are not in contact with each other. Thus, a core pin and a MFPI pin may not be electrically coupled to each other, unless those are shorted by a shorting bar. Thus, the shorting bars may be used to interconnect a desired core pin with a desired MFPI pin, and hence, may be used to configure the pins of the chip 100. In various embodiments, some of the shorting bars may also be used as channel jumpers, and may optionally be used for interconnecting two or more core pins.

In various embodiments, one of the shorting bars may lie in a plane that is different from one or more planes in which some of the core and MFPI pins lie. For example, the shorting bar 130 may lie in a plane that is different from a plane in which the core pin 124*b* lies. In various embodiments, the shorting bars may lie above some of the core and MFPI pins, yet not touch those pins to ensure that electrical connection is not established. For example, shorting bar 130*a* may lie above the core pin 124*b*, yet not touch the core pin 124*a*. That is, there may be a gap between the shorting bar layer and the core/MFPI pin layer. A via (e.g., 132*a*) may extend through this gap to couple an end of a shorting bar (e.g., 130*a*) with a core/MFPI pin (e.g., core pin 124*a*). In various embodiments, although not illustrated in FIG. 4, one or more of the shorting bars may lie below or underneath some of the core and MFPI pins, yet not touch those pins to ensure that electrical connection is not established.

Figure 5:
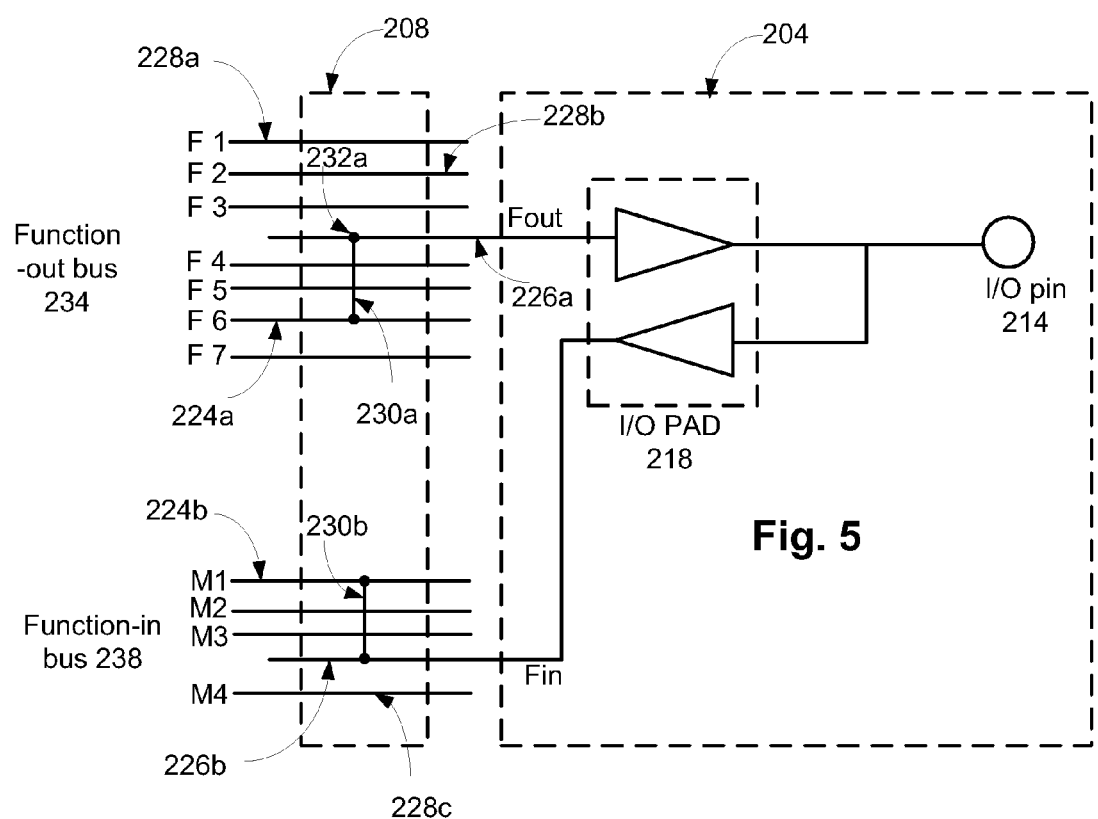
FIG. 5 illustrates an exemplary embodiment of a segment of a connection box and an MFPI, in accordance with various embodiments of the present invention.

FIG. 5 illustrates an exemplary embodiment of a segment of a connection box 208 and an MFPI 204, in accordance with various embodiments of the present invention. In various embodiments, the segment of the connection box 208 and the MFPI 204 of FIG. 5 may be similar to the corresponding components of FIGS. 3 and 4.

In various embodiments, the MFPI 204 of FIG. 5 may include an I/O pin 214 and an I/O pad 218. As will be readily understood by those skilled in the art, several well known components of the MFPI 204 (e.g., input enable, output enable, drive strength control, slew rate control, pull up, pull down, etc.) have not been illustrated in FIG. 5 for the purpose of clarity.

The MFPI 204 of FIG. 5 may also include MFPI pins 226*a* and 226*b*, wherein an end of each of the MFPI pins 226*a* and 226*b* may be coupled to the I/O pin 214 through the I/O pad 218. FIG. 5 also illustrates a plurality of function-out buses 234 (F1, . . . , F7) and function-in buses 238 (M1, . . . , M4), each connected to a corresponding core pin. Only some of the core pins have been labeled in FIG. 5 for the purpose of clarity.

The connection box 208 of FIG. 5 may include a shorting bar 230*a* configured to electrically interconnect core pin 224*a* (coupled to function-out bus F6) and MFPI pin 226*a* through via 232*a* and via 232*b*, respectively (note that only via 232*a* has been labeled in the figure). Similarly, the connection box 208 may also include a shorting bar 230*b* configured to electrically interconnect core pin 224*b* and MFPI pin 226*b* through a respective via. There may be a plurality of core pins (e.g., 228*a*, 228*b*, 228*c*) that are not coupled to a shorting bar.

Figure 1:
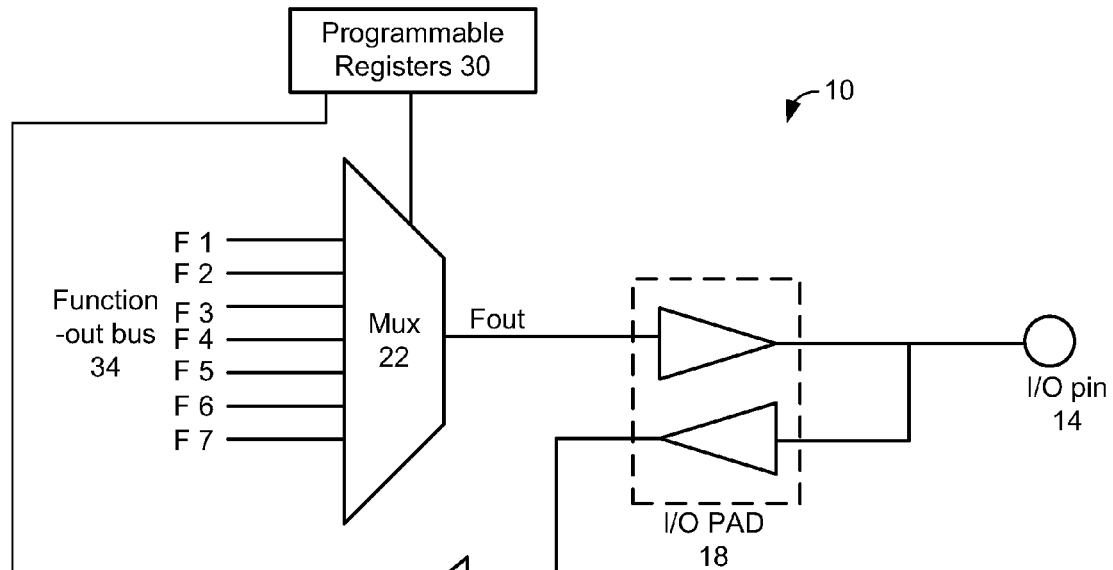
FIG. 1 illustrates an exemplary block diagram of a multiple function pin interface (MFPI)
Figure 2:
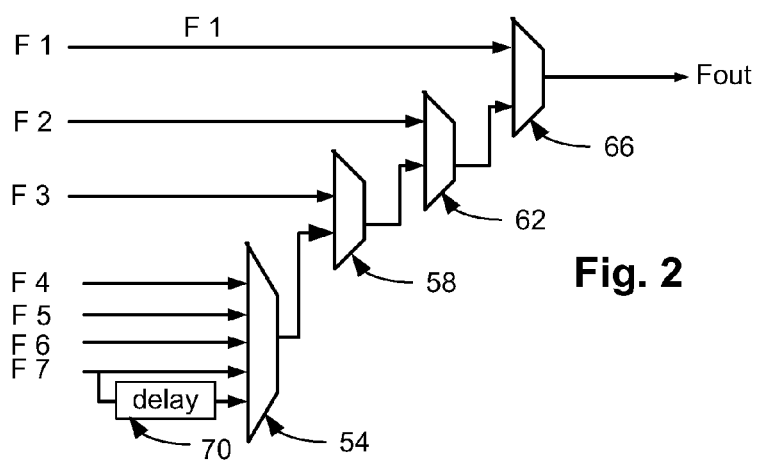
FIG. 2 illustrates an exemplary block diagram of a multiplexing system, which may be used in the MFPI of FIG. 1.

The connection boxes of FIGS. 3-5, including the shorting bars, have several advantages over the conventional MFPI system 10 of FIGS. 1 and 2 (where a multiplexer may be used to connect a desired core pin with a MFPI pin). For example, unlike the conventional MFPI system 10 of FIGS. 1 and 2, the configuration of the shorting bars in FIGS. 3-5 may be programmable and easily changed or re-designed. That is, only one layer of metal interconnect (the shorting bar layer) and via changes may be necessary to alter the pin configuration (i.e., changing the connection between the core pins and the MFPI pins) of the chip of FIGS. 3-5.

For example, according to the usage model of FIG. 5, function-out bus F6 and function-in bus M1 are coupled to the I/O pin 214. However, if a different usage model (to be used by a different user) requires function-out bus F1 and function-in bus M4 be coupled to the I/O pin 214, it can easily be achieved by merely changing the connection of the shorting bars 232*a* and 232*b*. Thus, the pin configuration of the chip of FIGS. 3-5 may be relatively easily altered in the design stage of the chip (even immediately before the tape-out of the chip), based on a usage model of the chip required by a specific user. In sharp contrast, a change in the pin configuration of the conventional MFPI system 10 of FIGS. 1 and 2 may require re-configuring a plurality of multiplexers (e.g., multiplexers 22, 54, 58, 62, 66, etc.) and/or demultiplexers (e.g., demultiplexer 26), and possibly fixing other timing issues arising as a result of any such re-configuration, as previously discussed, which may require substantial design effort. Using the connection box and the shorting bars of FIGS. 3-5, it may be relatively easy to re-configure and/or re-design a chip for a specific usage model required by a specific user by merely changing the shorting bar connections, thereby avoiding an arduous task of re-configuring and/or re-designing numerous other components of the chip.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments illustrated and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An integrated circuit device comprising:
   a first metal interconnect, an end of the first metal interconnect being coupled to a core of the integrated circuit device;
   a second metal interconnect, an end of the second metal interconnect being coupled to a first input/output (I/O) pin;
   a third metal interconnect configured to be coupled to the first metal interconnect and to the second metal interconnect;
   a fourth metal interconnect, an end of the fourth metal interconnect being coupled to another core of the integrated circuit device; and
   a fifth metal interconnect, an end of the fifth metal interconnect being coupled to a second I/O pin;
   wherein the fourth metal interconnect and the fifth metal interconnect are substantially parallel to the first metal interconnect and the second metal interconnect; and
   wherein the third metal interconnect lies in a plane that is different from a plane that includes the fourth metal interconnect and a plane that includes the fifth metal interconnect such that the third metal interconnect is not electrically interconnected to either the fourth metal interconnect or the fifth metal interconnect.

2. The integrated circuit device of claim 1, wherein the first metal interconnect and the second metal interconnect are substantially parallel to each other.

3. The integrated circuit device of claim 1, wherein the third metal interconnect is further configured to electrically interconnect the first metal interconnect with the second metal interconnect.

4. The integrated circuit device of claim 1, wherein the third metal interconnect is further configured to be coupled to the first metal interconnect and the second metal interconnect through a first via and a second via, respectively.

5. The integrated circuit device of claim 1, wherein at least one segment of the third metal interconnect is configured to be substantially perpendicular to the first metal interconnect and the second metal interconnect.

6. The integrated circuit device of claim 1, wherein the first I/O pin is a multifunction pin.

7. The integrated circuit device of claim 1, further comprising:
a sixth metal interconnect, wherein the sixth metal interconnect is configured to be coupled to the fourth metal interconnect and the fifth metal interconnect, and wherein a segment of the sixth metal interconnect is substantially perpendicular to both the fourth metal interconnect and the fifth metal interconnect.

8. The integrated circuit device of claim 1, wherein the integrated circuit device has a system on chip (SOC) architecture.

9. An integrated circuit chip comprising:
a plurality of input/output (I/O) pins, parallel to each other;
a plurality of core pins, each core pin coupled to a core of the integrated circuit chip; and
a plurality of shorting bars, wherein a first end of a first shorting bar of the plurality of shorting bars is configured to be coupled to a first I/O pin of the plurality of I/O pins and a second end of the first shorting bar is configured to be coupled to a first core pin of the plurality of core pins.

10. The integrated circuit chip of claim 9, wherein the first shorting bar is configured to electrically interconnect the first I/O pin and the first core pin.

11. The integrated circuit chip of claim 9, wherein the integrated circuit device has a system on chip (SOC) architecture.

12. The integrated circuit chip of claim 9, wherein the first I/O pin and the first core pin are substantially parallel to each other, and perpendicular to the first shorting bar.

* * * * *